US010160254B2

(12) United States Patent
Dobson

(10) Patent No.: US 10,160,254 B2
(45) Date of Patent: *Dec. 25, 2018

(54) LIFT TAB HANGING STRUCTURE

(71) Applicant: LSC COMMUNICATIONS US, LLC, Chicago, IL (US)

(72) Inventor: Paul F. Dobson, Washington, MO (US)

(73) Assignee: LSC COMMUNICATIONS US, LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/824,664

(22) Filed: Nov. 28, 2017

(65) Prior Publication Data

US 2018/0079252 A1 Mar. 22, 2018

Related U.S. Application Data

(63) Continuation of application No. 14/805,146, filed on Jul. 21, 2015, now Pat. No. 9,855,787, which is a continuation of application No. 13/731,748, filed on Dec. 31, 2012, now Pat. No. 9,114,661, which is a continuation of application No. 13/474,170, filed on May 17, 2012, now abandoned.

(60) Provisional application No. 61/487,171, filed on May 17, 2011.

(51) Int. Cl.
*B42F 15/00* (2006.01)
*B42F 21/04* (2006.01)

(52) U.S. Cl.
CPC .......... *B42F 15/00* (2013.01); *B42F 15/0035* (2013.01); *B42F 21/045* (2013.01); *H05K 999/99* (2013.01)

(58) Field of Classification Search
CPC .... B42F 15/00; B42F 15/0035; B42F 21/045; B42F 21/04; B42F 21/06; B42F 21/08; B42F 21/065; B42F 9/007
USPC ................................................ 229/67.1–67.4
See application file for complete search history.

(56) References Cited

U.S. PATENT DOCUMENTS

| | | | |
|---|---|---|---|
| 626,901 | A | 6/1899 | Gilman |
| 958,050 | A | 5/1910 | Whipple |
| 1,048,577 | A | 12/1912 | Pardoe, Jr. |
| 1,688,965 | A | 10/1928 | Heiland |
| 1,697,985 | A | 1/1929 | Lindsay |
| 1,711,895 | A | 5/1929 | Lehman et al. |

(Continued)

FOREIGN PATENT DOCUMENTS

| | | |
|---|---|---|
| CH | 646649 | 12/1984 |
| CH | 673984 | 4/1990 |

(Continued)

OTHER PUBLICATIONS

International Searching Authority, "International Preliminary Report on Patentability," issued in connection with PCT Application No. PCT/US2012/038345, dated Nov. 19, 2013, 4 pages.

(Continued)

*Primary Examiner* — Peter Helvey
(74) *Attorney, Agent, or Firm* — Hanley Flight & Zimmerman, LLC

(57) ABSTRACT

Disclosed herein are adjustable tab mechanisms for a hanging folder. An example tab mechanism includes an indexing portion movable between an expanded position and a retracted position. The example tab mechanism also includes a support portion positioned in a pocket formed by a cover panel of the folder. The support portion has a first fold extending over a hanging member.

16 Claims, 8 Drawing Sheets

(56) References Cited

U.S. PATENT DOCUMENTS

| | | | |
|---|---|---|---|
| 2,260,407 | A | 10/1941 | Schade |
| 2,300,623 | A | 11/1942 | Hornung |
| 2,679,846 | A | 6/1954 | Addison |
| 2,895,448 | A | 7/1959 | Haines |
| 3,037,510 | A | 6/1962 | Saymon |
| 3,039,470 | A | 6/1962 | Podner |
| 3,132,628 | A | 5/1964 | Gehlsen |
| 4,184,699 | A | 1/1980 | Lowe, Jr. |
| 4,209,925 | A | 7/1980 | Brugmann |
| 4,255,888 | A | 3/1981 | Bastogne |
| 4,318,236 | A | 3/1982 | Giulini |
| 4,905,393 | A | 3/1990 | Laurie |
| 4,967,951 | A | 11/1990 | Sherman |
| 5,160,296 | A | 11/1992 | Katz |
| 5,226,676 | A | 7/1993 | Su |
| 5,226,734 | A | 7/1993 | Scott |
| 5,311,685 | A | 5/1994 | Wyant |
| 5,341,982 | A | 8/1994 | Syers |
| 5,540,513 | A | 7/1996 | Wyant |
| 5,639,124 | A | 6/1997 | Jung |
| 5,692,670 | A | 12/1997 | Ho |
| 5,899,626 | A | 5/1999 | Hatano et al. |
| 5,996,881 | A | 12/1999 | Smith |
| 6,732,461 | B2 | 5/2004 | Slattery et al. |
| 6,883,460 | B2 | 4/2005 | Weisenfeld |
| 6,928,761 | B2 | 8/2005 | Frappell |
| 6,976,449 | B2 | 12/2005 | Weisenfeld |
| 7,025,382 | B2 | 4/2006 | Wiggins |
| 7,040,051 | B2 | 5/2006 | Windorski |
| 7,125,050 | B2 | 10/2006 | Yamamoto et al. |
| 7,334,363 | B1 | 2/2008 | Hansen |
| 7,389,598 | B2 | 6/2008 | Bunger et al. |
| 7,610,707 | B1 | 11/2009 | Payne |
| 7,628,426 | B1 | 12/2009 | Rowe et al. |
| 8,117,774 | B2 | 2/2012 | Meltzer |
| 8,141,282 | B2 | 3/2012 | Goodfellow et al. |
| 8,443,534 | B2 | 5/2013 | Goodfellow et al. |
| 8,733,003 | B2 | 5/2014 | Bowman et al. |
| 9,114,661 | B2 | 8/2015 | Dobson |
| 2003/0074817 | A1 | 4/2003 | Saylor |
| 2003/0126779 | A1 | 7/2003 | Sato et al. |
| 2005/0236831 | A1 | 10/2005 | Wiggins |
| 2005/0257408 | A1 | 11/2005 | Black |
| 2006/0000134 | A1 | 1/2006 | Windorski |
| 2006/0242869 | A1 | 11/2006 | Bunger et al. |
| 2007/0119082 | A1 | 5/2007 | Gilchrist |
| 2007/0234601 | A1 | 10/2007 | Yoo et al. |
| 2009/0133305 | A1 | 5/2009 | Calistri et al. |
| 2009/0178320 | A1 | 7/2009 | Goodfellow et al. |
| 2011/0173855 | A1 | 7/2011 | Meltzer |
| 2011/0215135 | A1 | 9/2011 | Goodfellow et al. |
| 2012/0111930 | A1 | 5/2012 | Maistrellis |
| 2012/0267424 | A1 | 10/2012 | Goodfellow et al. |
| 2015/0321501 | A1 | 11/2015 | Dobson |

FOREIGN PATENT DOCUMENTS

| | | |
|---|---|---|
| CN | 102015322 | 4/2011 |
| DE | 3718633 | 8/1988 |
| GB | 2342320 | 4/2000 |
| JP | 2001150857 | 6/2001 |
| KR | 20060109031 | 10/2006 |
| WO | 9002661 | 3/1990 |
| WO | 2013066406 | 5/2013 |

OTHER PUBLICATIONS

International Searching Authority, "Written Opinion of the International Searching Authority and International Search Report," issued in connection with PCT Application No. PCT/US2012/038345, dated May 23, 2013, 11 pages.

United States Patent and Trademark Office, "Office Action," issued in connection with U.S. Appl. No. 13/068,839, dated May 11, 2012, 20 pages.

United States Patent and Trademark Office, "Notice of Allowance," issued in connection with U.S. Appl. No. 13/068,839, dated Jan. 24, 2013, 21 pages.

State Intellectual Property Office of People's Republic of China, "Notification of the First Office Action," issued in connection with Chinese Patent Application No. 201280023912.X, 14 pages.

International Searching Authority, "International Search Report", dated Aug. 31, 2011 for International Application No. PCT/US2011/021933, 4 pages.

International Searching Authority, "International Written Opinion", dated Aug. 31, 2011 for International Application No. PCT/US2011/021933, 4 pages.

Canadian Intellectual Property Office, "Office Action", issued in connection with Canadian Patent Application No. 2,834,585, dated Jan. 29, 2016 (3 pages).

Canadian Patent Office, "Office action", issued in connection with Canadian patent application No. 2,834,585, dated Nov. 18, 2016, 3 pages.

United States Patent and Trademark Office, "Restriction Requirement", issued in connection with U.S. Appl. No. 14/805,146, dated May 20, 2016, 6 pages.

United States Patent and Trademark Office, "Non-Final office action", issued in connection with U.S. Appl. No. 14/805,146, dated Jul. 29, 2016, 28 pages.

United States Patent and Trademark Office, "Final office action", issued in connection with U.S. Appl. No. 14/805,146, dated Feb. 7, 2017, 20 pages.

United States Patent and Trademark Office, "Non-Final office action", issued in connection with U.S. Appl. No. 14/805,146, dated May 9, 2017, 13 pages.

United States Patent and Trademark Office, "Notice of Allowance", issued in connection with U.S. Appl. No. 14/805,146, dated Aug. 30, 2017, 16 pages.

United States Patent and Trademark Office, "Supplemental Notice of Allowance", issued in connection with U.S. Appl. No. 14/805,146, dated Sep. 15, 2017, 7 pages.

United States Patent and Trademark Office, "Notice of Allowance", issued in connection with U.S. Appl. No. 13/731,748, dated Apr. 24, 2015, 19 pages.

United States Patent and Trademark Office, "Non-Final office action", issued in connection with U.S. Appl. No. 13/731,748, dated Nov. 4, 2014, 17 pages.

LIFT TAB HANGING STRUCTURE

CROSS-REFERENCE TO RELATED APPLICATIONS

This patent arises as a continuation of U.S. patent application Ser. No. 14/805,146, filed on Jul. 21, 2015, which is a continuation of U.S. patent application Ser. No. 13/731,748, filed on Dec. 31, 2012, which is a continuation of U.S. patent application Ser. No. 13/474,170, filed on May 17, 2012, which claims the benefit of U.S. Provisional Application Ser. No. 61/487,171, filed on May 17, 2011, all of which are incorporated herein by reference in their entireties.

TECHNICAL FIELD

The present subject matter relates generally to a tabbing system, such as for identification or informational purposes for files, and more specifically to a tabbing system with an indexing segment that is retractable.

BACKGROUND

File folders having tabs extending from an edge of the folder are known. Tabs can be formed integrally with the folder such that they are permanent extensions of the folder, or provided as separate members that can be attached to the folder. It is common practice to provide tab members which extend from the edge of file folders, index dividers, hanging files, binders, etc., at selected positions so that the folder, divider, or binder can be easily identifiable or to provide information regarding the contents of such file. For example, separable tabbing members are often used for insertion into slots near the edges of hanging files.

Additionally, when a series of tabbed hanging files are desired, the user must make sure that the tabs are inserted so that they are staggered for easy viewing. This is made often less than convenient since the user needs a separate set of tab members and must correctly judge which slots in which to insert the tab member edges so that each tab is staggered when multiple hanging file folders are viewed. Another problem with this type of tab member is sometimes the tab member is dislodged from the folder slots and lost.

Labels on the tab members may require changing to reflect the changing contents of the file folder or to allow the folder to be reused for a different purpose. Changing labels requires the old label to be removed from the tab member (a difficult task in itself), which often necessitates removing the tab member from the folder before the new label can be inserted and the tab member reinstalled in the file folder. In addition to the inconvenience and inefficiency involved in changing the index information on a file folder, the prior art system also suffers from a tendency for the labels to fall out of the tab member and become lost.

It is also known to provide movable tabs on folders. For example, U.S. Pat. No. 5,996,881 discloses a convertible folder with a tab that is secured to a pair of elongate slots such that it is movable up and down the slots between a display position and an out-of-way position. The top portion of the tab is substantially wider than the distance between the slots such that the top portion remains protruding on top of and out of plane from the folder in the out-of-way position. U.S. Pat. No. 5,341,982 discloses file folder having a tab that is placed at an outer corner of the folder. The tab is secured to the folder by a rivet such that it can be rotated 90 degrees to extend from either edge of the corner. U.S. Publication No. 2007/0119082 discloses a folder tab that includes a fixed base and a movable title portion, such that the title portion can be raised and lowered within the base. The title portion remains protruding from the folder even in the lowered position.

Also, when a series of folders are desirable it is important that the user obtains folders in which the integral tab member is positioned differently. Otherwise, the series of folders will have the tabs obstructing the view of other tabs that follow. U.S. Pat. No. 6,910,622, for example, provides a suspended file folder having a support bar along an upper portion thereof, having notches therein for engagement with an index tab. The tab is rotatable about the support bar. U.S. Pat. No. 6,332,285 provides an indexing tab that is movable along an, upper portion of the folder. However, both of these indexing tabs may still be dislodged, and the problems with changing labels found in the prior art.

A further problem encountered with prior art designs includes the folder material fatigue that occurs over time at the folded area wherein the suspensions bar is inserted. This folded area supports the entire weight of the folder and its contents by means of the bar, and over time, this folded area can become weakened, and possibly even tear, separating the suspension bar from the folder and thus rendering the folder unhangable.

It is thus desirable for a tabbing system that allows tabs to be readily extended or retracted while remaining stably in either position. It is thus further desirable for a hanging folder with a reinforcing structure to prevent damage in the area of the suspension bar.

SUMMARY

In one embodiment, disclosed herein is a hanging file, which may include a hanging member configured for hanging from a support structure; a tab mechanism including: a support portion supported by and extending over the hanging member, and an indexing portion that extends from the support portion; and a file cover including a cover panel having a first folded-over edge portion that is supported in a hanging configuration from the tab mechanism support portion.

In variations of this embodiment, the hanging member may have an upper surface, and the support portion may hang from the hanging member upper surface. The support portion may be disposed between the hanging member and the edge portion of the file cover. The edge portion may extend over the tab mechanism and is affixed to the file panel below the tab mechanism panels, thereby providing an enclosed pocket substantially containing the tab mechanism. The support portion may include a first panel and a second panel disposed on opposite sides of the hanging member, with a fold between the panels extending over the top of the hanging member. The second tab mechanism panel may include: an anchor portion attached to the first tab mechanism panel; and an intermediate portion connecting the anchor portion and indexing portion and configured for folding to allow the indexing portion to move between a retracted position and an extended position, wherein the indexing portion, intermediate portion, and anchor portion may be hingedly connected to each other for allowing the indexing portion to slide between a retracted position, substantially within the pocket, and an extended position, protruding from the pocket as a tab. The file cover may define an opening for receiving the indexing portion therethrough. The folder may include a plurality of tab mechanisms and a plurality of openings. The openings may be disposed along an edge of the fold. The indexing portion may be configured for protruding from the edge portion in an extended position and may be received within a pocket in a retracted position. The intermediate portion may include a plurality of intermediate segments hinged to each other for progressively retracting and extending the indexing portion. The edge portion may define an opening for the indexing portion, the opening including an exposing portion extending onto the edge portion to expose a side of the indexing portion in the retracted position to permit gripping the indexing portion for pulling it to the extended position. The opening may include a slit at a lateral side of the opening, and the indexing portion may have a retaining portion that extends laterally beyond the exposing portion such that the retaining portion is extractable through the slit, and the edge portion may include a securing portion adjacent the opening to retain the indexing portion in front of the slit in the extended position in cooperation with the retaining portion. The indexing portion may have a retaining portion on each lateral side thereof, and the opening may include a slit on each lateral side thereof. The file cover may include a second file panel hinged to the first file panel and a second hanging member associated with the second file panel for hanging both file panels from rails for supporting contents within the hanging file. Further, the hanging member may include a hanging bar with a notch at each end to receive and hang from rails.

In another embodiment, disclosed herein is a hanging file that may include: a hanging member configured for hanging from a support structure; a file cover including a cover panel having a first folded-over edge portion that may be supported in a hanging configuration from the tab mechanism support portion, wherein the edge portion defines an opening for the indexing portion, and wherein the opening comprises a slit at a lateral side of the opening; and a tab mechanism that may include an indexing portion, wherein the indexing portion may have a retaining portion that is wider than the opening but is extractable through the slit, and wherein a securing portion adjacent the opening and the slit may be configured to cooperate with the retaining portion when extended through the slit and pulled inward over the securing portion to lockedly retain the indexing portion in the extended position in front of the slit.

In variations of this embodiment, the indexing portion may have a retaining portion on each lateral side thereof, the opening may include a slit on each lateral side thereof, and wherein a securing portion may be provided adjacent to both slits. A plurality of tab mechanisms and a plurality of openings may be provided. Further, the tab mechanism may include a support portion supported by and extending over the hanging member.

In yet another embodiment, disclosed herein is a hanging file that may include: a hanging ember configured for hanging from a support structure; a file cover including a cover panel having a folded-over edge portion that is supported in a hanging configuration from the hanging member; and a support portion supported by and extending over the hanging member, and positioned between the folded-over edge portion and the hanging member.

In variations of this embodiment, the folded-over edge portion may include one or more openings. One or more indexing portion slidable through the one or more openings may be provided. The one or more indexing portions and the support portion may be integral. Further, the support portion may be adhesively secured to an inner side of the folded-over edge portion.

Additional advantages and novel features of the examples will be set forth in part in the description which follows, and in part will become apparent to those skilled in the art upon examination of the following description and the accompanying drawings or may be learned by production or operation of the examples. The advantages of the concepts may be realized and attained by means of the methodologies, instrumentalities and combinations particularly pointed out in the appended claims.

BRIEF DESCRIPTION OF THE DRAWINGS

The drawing figures depict one or more implementations in accord with the present concepts, by way of example only, not by way of limitations. In the figures, like reference numerals refer to the same or similar elements.

DETAILED DESCRIPTION

Figure 1:
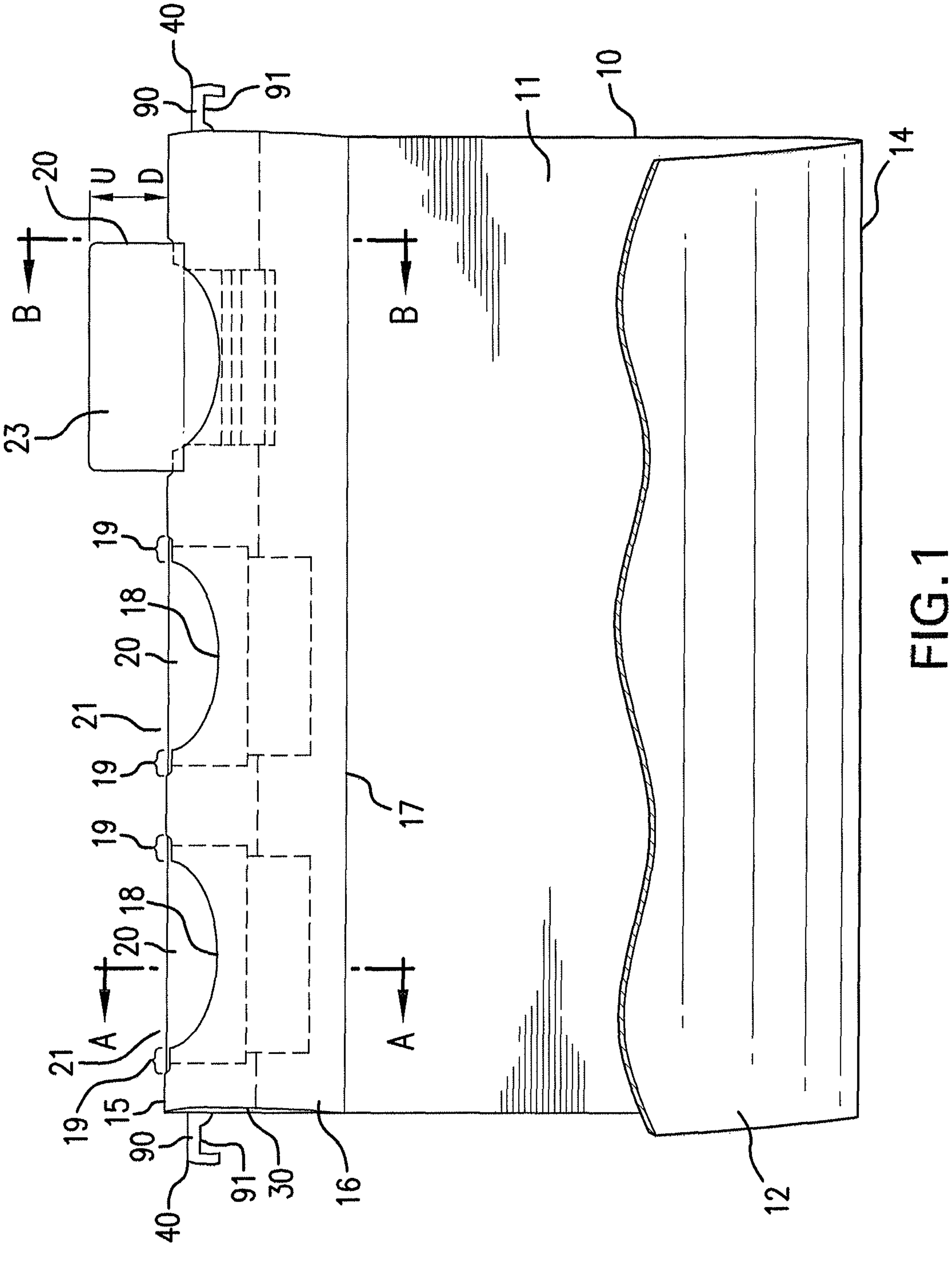
FIG. 1 is a front view of an embodiment of a hanging file with slidable indexing portions.
Figure 2:
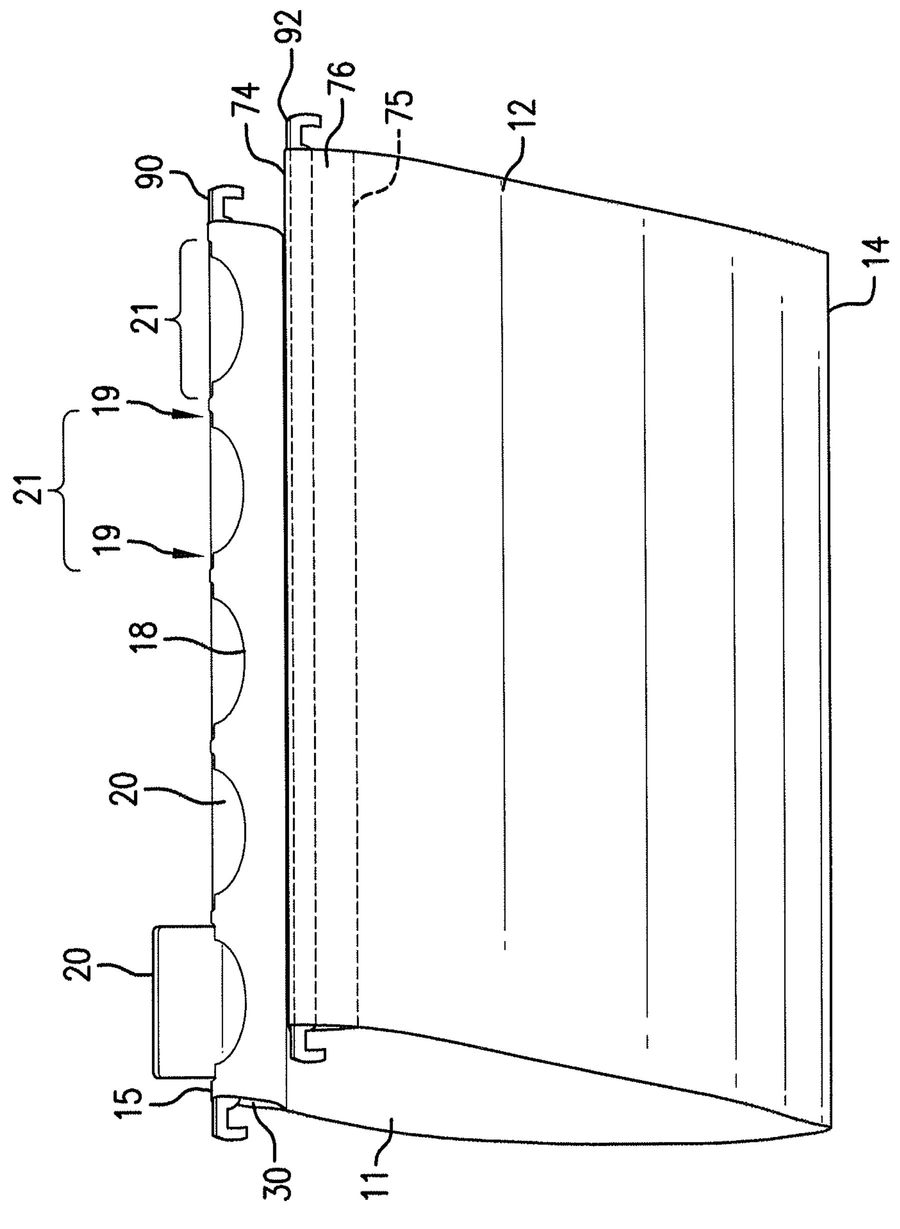
FIG. 2 is a top view of the hanging file of FIG. 1.

Referring to FIGS. 1 and 2, a hanging file folder 10 is provided with slidable indexing portions 20 housed in a pocket 30. The folder can be made of any suitable material such as paper, cardboard, plastic, etc., and it can be laminated to add strength. The indexing portion can be made of any suitable material such as paper, cardboard, plastic, etc., and it can be laminated to add strength. The hanging file folder 10 can have a first cover panel 11 and a second cover panel 12 hinged to the first cover panel 11, and hook members 40 or other such hanging members or structures for hanging the file folder 10. Hook members or hanging members 40 can be provided on the first cover panel 11 and also be provided on the second cover panel 12 for hanging both file panels from rails for supporting contents within the hanging file. The hanging members 40 can comprise a hanging bar 90, 91 (see FIG. 2) with a notch 91 at each end to receive and hang from rails.

The preferred hook members are provided on bars that extend across the top of the two folder panels, and have a recess configured for receiving and hanging from shelf or drawer rails, as known in the art. The file folder can be unitary such that it is folded at fold line 14 to provide the first cover panel 11 and second cover panel 12. The pocket 30 can be a hollow space formed by folding over a top portion of the first cover panel over fold edge 15, and attaching at least an edge portion 17 of the folded-over portion 16 to an inner portion of the first cover panel 11 as shown in FIG. 1. A pocket can also be provided on the cover panel 12, though in some embodiments such pocket is not as large as the pocket 30. In other embodiments, there is no pocket on the panel 12, and the folded over portion indicated at 76 is flush with the folder. The edge portion 17 can be attached by use of an adhesive or alternatively, a pressure sensitive adhesive strip (not shown) applied to the back side of the edge portion 17. As shown in FIG. 2, the second panel 12 may have fold edge 74, and edge portion 76 that extends to the bottom of the folded-over part 75.

In a preferred embodiment, the tab pocket 30 is formed by folding an edge portion of the panel 11 and adhesively securing the folded portion 16 to preferably the interior of the panel 11. In other embodiments, separate tab holder structures can be attached to the folder 10, for example by gluing. The pocket 30 preferably does not add significantly thickness or bulk of the folder 10. Only a portion of the folded portion 16, such as the peripheral edge 17, is preferably adhesively attached to the panel 11 such that the unattached folded portion and the panel 11 form a tab holding pocket 30 therebetween. In other embodiments, other portions of the folded portion 16, such as between openings 21, can be attached to the panel 11, to separate individual pockets 30. The pocket 30 is dimensioned to receive the indexing portion 20 therein.

An opening 21 for receiving the indexing portion, such as a slot, is defined in the pocket 30, for example by removing a portion of the folded portion 16 and/or panel 11 proximate the edge 15. The openings 21 can be formed by removing a portion of either the folded portion 16 or panel 11 or both. The opening can be formed before or after the folded portion 16 and panel 11 are attached. One or more openings 21 may be provided, e.g., 1, 2, 3, 4, 5, 6, 7, 8, 9, or more openings. With respect to the edge 15, the openings 21 may result in the removal of a substantial portion of the folder material along the edge 15. For example, the openings 21 may result in only about 50% of the edge material remaining, or about 40%, or 30%, or 20%, or 10% or 5%, or any range thereinbetween, that is greater than 0%. The distance between openings 21 may be a percentage of the opening, for example about 200%, 150%, 50%, 40%, or 30%, or 20%, or 10% or 5%, or any range thereinbetween, that is greater than 0%.

The opening 21 is preferably sized and configured to facilitate grasping of the indexing portion 20 therein by hand to extend the indexing portion. The opening 21 can have any suitable configuration, such as the half-moon configuration shown in FIG. 1, a trapezoidal configuration, a rectangular configuration, or other configurations that may be curved configurations. The folder 10 can include any suitable number of openings. The openings may only be provided on one side of the folder portion 16, preferably the inner side. For example, the number of openings can be selected based on the desired folder and indexing portion configuration and sizes of the folder and indexing portions. A conventional manila folder or a hanging folder having a width of about 12 to 15 inches can include 1 to 7 openings along an edge of the folder, preferably 2 to 5 openings, and more preferably 3 or 4 openings, for holding the corresponding number of indexing portions. If smaller indexing portions are used, more openings are also possible. When the folder 10 includes multiple openings 21, the openings 21 are preferably separated by a suitable distance such that adjacent indexing portions do not contact each other, as shown in FIG. 1. In an example, adjacent ends of adjacent openings are separated by at least about 1 inch. Preferably, adjacent openings are separated by between about 1 to 4 inches. However, openings can be separated by about less than an inch, e.g., about 0.75 inches, 0.5 inches, 0.25 inches, or less but great than 0 inches.

Figure 6:
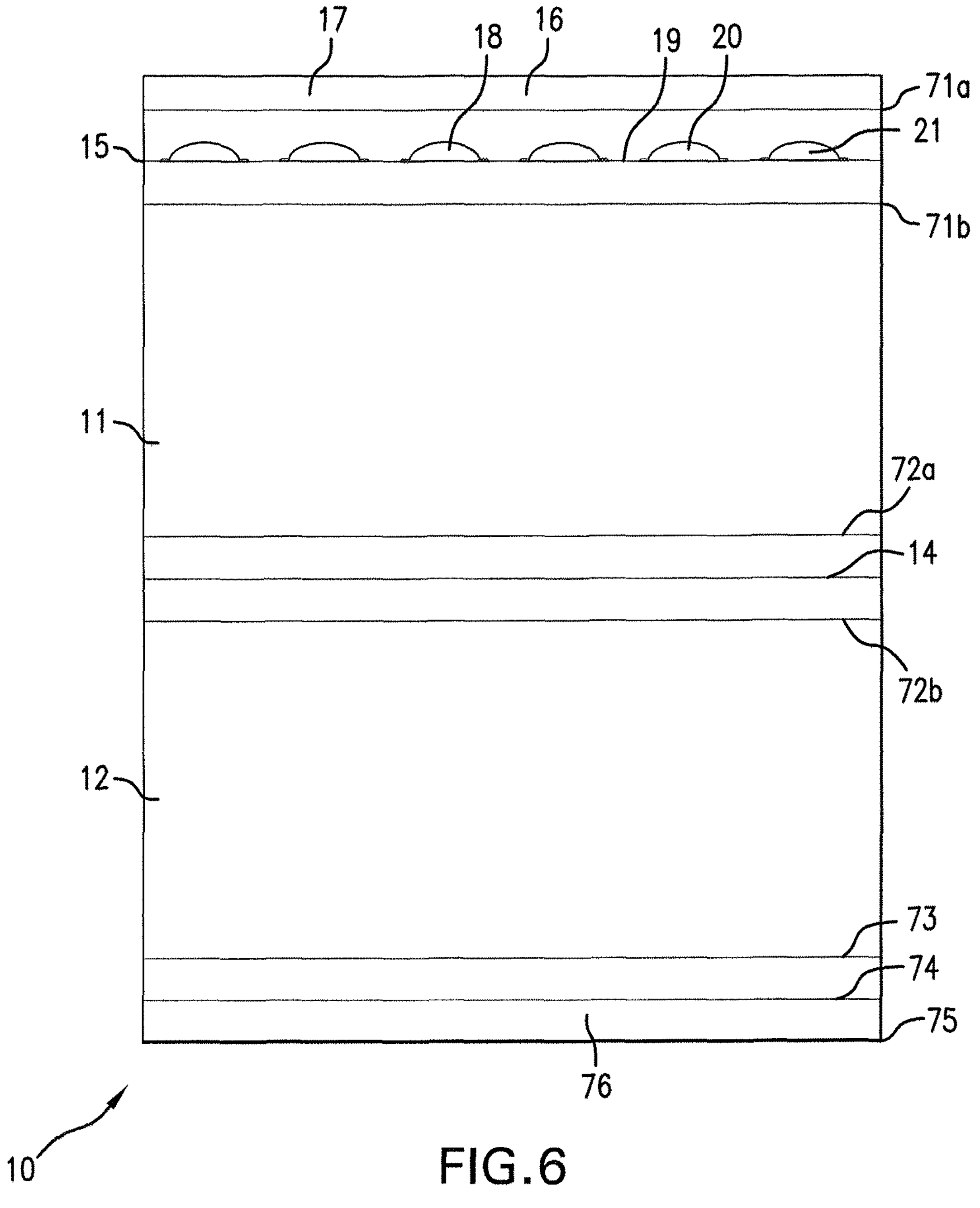
FIG. 6 is an example folder blank in accordance with one embodiment.

FIG. 6 depicts a blank to make the folder 10. Adhesive may be provided between lines 72*a*, 72*b* to make the bottom fold 14 thicker than just a fold line. End 75 may be folded over line 74 to line 73 to make an enclosure for the second support bar. Adhesive may be applied in this area. Lines 71*a* and 71*b* may be matched when folded over to create the pocket 30. As shown, this blank has more openings than shown in FIG. 1, and thus represents a different embodiment than in FIG. 1. As discussed previously, a variety of openings can be provided in various embodiments.

Three indexing portions 20 are provided in the file folder 10 in the embodiment of FIG. 1, but as would be understood by one of ordinary skill in the art, one or more indexing portions 20 can be provided, as would be necessary or appropriate for the structure to be indexed. As shown more clearly in FIG. 2, the first cover panel 11 has openings 21 at the fold edge 15. Since most of the paper of the fold edge 15 of the first cover panel 11 is cut away, only small strips of the paper remained hanging from and folded over the hanging member 40. The hanging member is positioned undernear these strips that remain. Thus, it will be appreciated that without some type of reinforcement, the strips would be subject to breaking, tearing, etc. in normal use as they would support the weight of the entire folder To solve this longevity problem, the plastic from the tabs themselves is mounted around the top of the hanging bar, so it takes the weight of the items held in the file. This may generally be referred to as a reinforcing portion. However, the reinforcing portion need not necessarily be integral with the tabs; it may be a separate piece from the tabs. The reinforcing portion can be provided with a folder with no tabs, but where there are cutouts that would require reinforcement, as discussed above. As shown in FIG. 1, the openings 21 can provide for the indexing portions 20 to be pulled upward in a direction U and out of the pocket 30. The indexing portions 20 can also be pushed back down in a direction D into the pocket 30. As shown in FIG. 1, the two left indexing portions 20 are contained within the pocket 30, and the indexing portion 20 on the right side is pulled out of the pocket 30, so that an indexing segment 23 is viewable by a user. Informational inserts (not shown) can be provided in the indexing segment 23 as known to one of ordinary skill in the art.

Figure 3A:
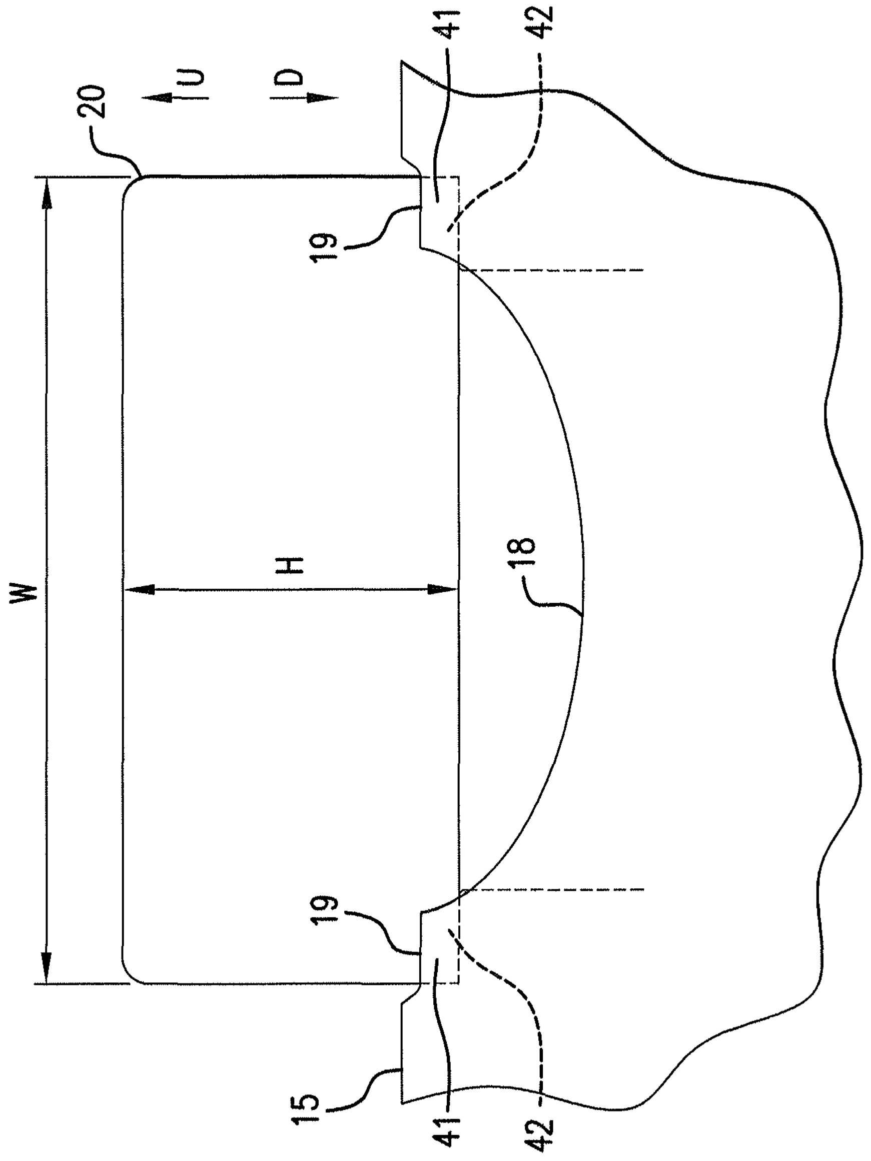
FIGS. 3(*a*) and 3(*b*) are front views of an embodiment of an indexing portion being lifted and then held against the file folder.
Figure 3B:
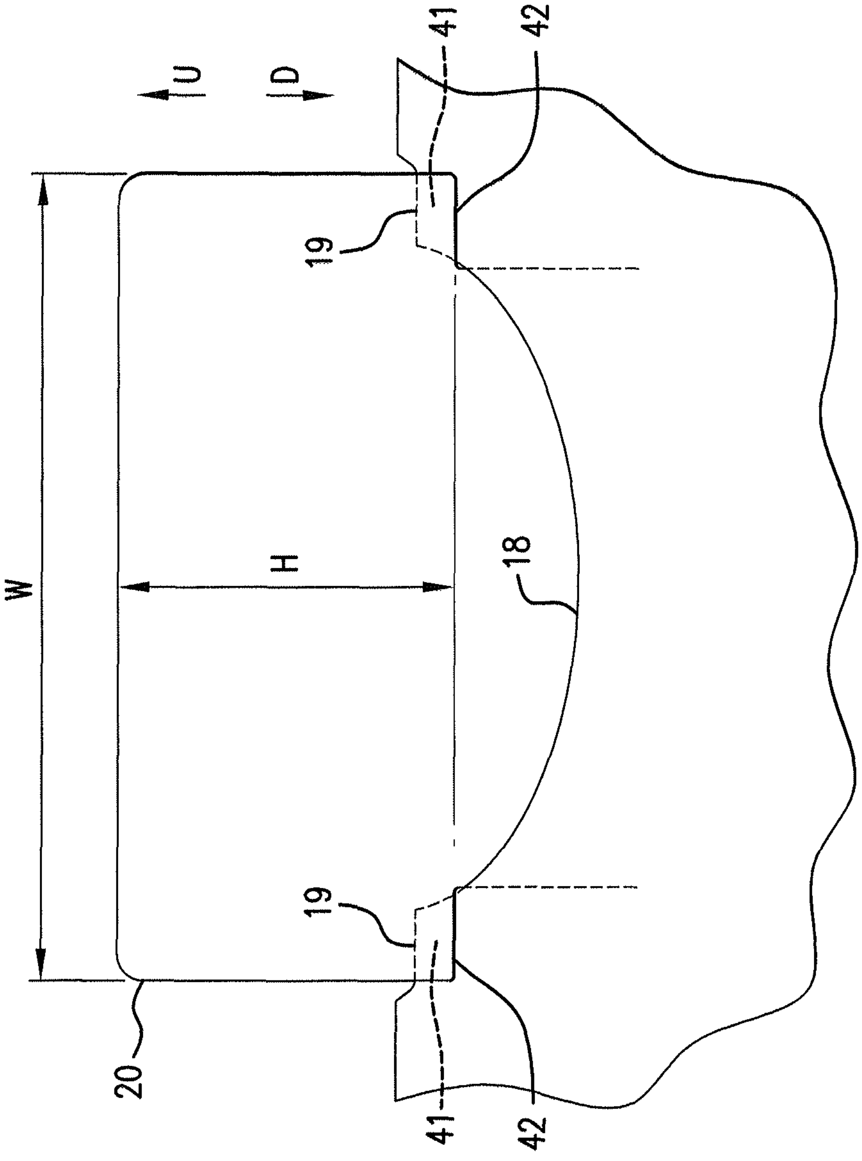

As shown in FIG. 3*a*, the openings 21 have bottom surfaces 18 that provide for a half-moon shape of the openings 21, although other shapes are possible as discussed above. Such half-moon shape of the openings 21 provide access by a thumb of a user. As seen in FIG. 2, slits 19 are provided laterally at the top folded edge 15 to accept the full width of the indexing portions 20. In some embodiments, the slits are not mere cuts along the edge 15, but have a definite (though small) width transverse to the edge length. Such thickness may be about 1 mm or less, or it may be between about 0.01 mms and 2 mms. In some embodiments, configurations other than slits may be provided, for example, a gap, a raised or lowered portion, an offset portion, etc. The indexing portion 20 is raised in a direction U until the entire height H of the indexing portion 20 is above the folded edge 15 of the first cover panel 11. Then, as shown in FIG. 3*b*, when the indexing portion is fully extended out of the opening 21, it is pulled slightly towards the inside, and the retaining portion 41 locks around the half-moon shape of the bottom surface 18 of the opening 21 that is narrower than the full width W of the indexing portion 20. This keeps the indexing portion 20 from retracting into the opening in a downward direction D. A securing portion 42 of the indexing portion 20 is shown in both FIGS. 3*a* and 3*b*; also shown therein is how this securing portion 42 cooperates with the retaining portion 41. In FIG. 3*a*, the indexing portion has been raised, but the securing portion 42 is behind the retaining portion 41, i.e., it is within the confines of the slit 19. From here, the indexing portion can be lifted further and brought inward, out of the slit 19, and over the retaining portion 41 to the inside of the folder. It is then brought downward to its resting position (slightly lower); this is shown in FIG. 3*b*. The indexing portion may be held thusly by cooperation between the retaining portion 41 and the securing portion 42. The indexing portion may be resiliently biased outward, such that to return the indexing portion inside the opening 21, it is lifted slightly and then brought in between the slits 19. The resilient bias both helps bring the tab back in, and helps retain it outside when locked (i.e., the resilient bias provides a frictional force between the portions 41, 42).

The folded-over portion 16 can define an opening 21 for the indexing portion 20, such that the opening 21 includes an exposing portion 65 extending onto at least the folded-over portion 16, which can be a concealing flap, to expose a side of the indexing portion 20 in the retracted position to permit gripping the indexing portion 20 for pulling it to the extended position. The opening 21 can include a slit 19 at a lateral side of the opening 21, or both lateral sides of the opening 21. The indexing portion 20 can have a retaining portion 41 that extends laterally beyond the exposing portion 65, such that the retaining portion 41 is extractable through the opening 21 and positionable outside the pocket 30 and against the outside of the pocket 30 to retain the indexing portion 20 in the extended position, as shown in FIG. 3*b*. The indexing portion 20 can have a retaining portion 41 on each lateral side thereof, and the opening 21 can include a slit 19 on each side of the exposing portion 80. The slit 19 functions in connection with the retaining portion 41, provided on lateral side of the indexing portions 20 and moveable within the slits 19, such that when the indexing portions 20 are extended upward (as shown on the slidable tab 20 in FIG. 3*b*, for example), the retaining portions 41 reach into the slit portion 19. The retaining portion provides an interlocking means with the top of the pocket 30, and the lateral edges thereof extend into the slits 19 to hold the indexing portion 20 in place over the pocket 30, but if a little force is applied in the downward direction D, the indexing portion 20 is easily pushed back inside the pocket 30.

The openings 21 take up a portion of the edge 15. The pieces remaining between the opening provide support for the hanging member. The openings to the remaining pieces may be rounded to provide a smooth transition therebetween, and also to provide better structural integrity.

Figure 4:
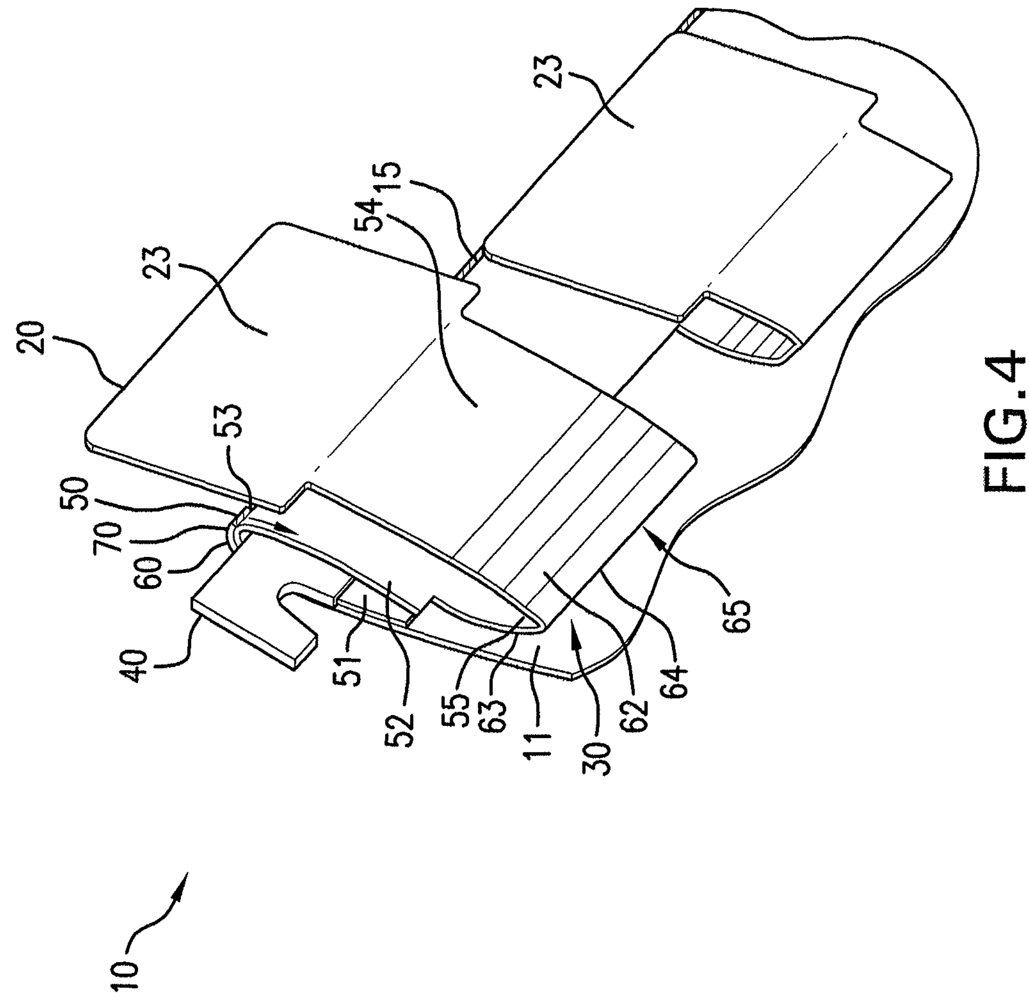
FIG. 4 is a side perspective view of a pocket of the file folder of FIG. 1.

FIG. 4 illustrates an embodiment of an interior of the pocket 30 of the hanging file folder 10. For clarity, the interior of the pocket 30 is shown with the edge portion 17 of the folded-over portion 16 unattached to the interior of the first cover panel 11. A hanging file folder 10 is provided with hanging member 40 and a tab mechanism including a support portion 50 and indexing portion 20 that extends from the support portion 50 and has an indexing segment 23 that can be configured for displaying writing thereon. The first cover panel 11 can have an edge 15 that can be at least partially supported from the support portion 50 of the tab mechanism.

As seen in FIG. 4, the support portion 50 can extend over the hanging member 40 for hanging therefrom. The support portion 50 can be made of a sheet of plastic material or paper, but is not limited to such. The support portion can be separate from or integral with the indexing portion. The fold edge 15 can be provided over the support portion 50 so that the file cover 10 is also supported by the support portion 50. The support portion 50 can be disposed between the hanging member 40 and the fold edge 15 of the file cover 10. It can be adhered to either side, or both sides, of the pocket 30. The folded layer over the hanging member may be provided a greater surface area and/or a more rounded support surface for the cut-out edge portion 16 to hang from by inclusion of a support member 50, regardless of whether the support member and the indexing portions form an integral component. The hanging member 40 can have a first region 60 in supportive contact beneath the support portion 50, and the support portion 50 can have a second region 70 in supportive contact beneath the fold edge 15 of the file cover 10. Adhesive may also be applied in either or both regions 60, 70. The second region 70 can have a larger surface area than the first region 60 for increasing an area of the file cover 10 that supports the load from the first cover panel 11. The second region 70 can blunter than the first region 60 for, e.g., improving durability of an area of the file cover 10 that supports the load from the first cover panel 1. The support portion 50 can be as long as the folder edge 15, e.g., wherein it is provided as an integral "spine" for the folder, or it may be broken up into two or more pieces (with space inbetween the pieces). The pieces may or may not correspond to and/or be integral with the indexing portions.

The pocket 30 of the file cover 10 can provide openings 21 for receiving the indexing portion 20 therethrough, and the first and second regions 60, 70 can be disposed adjacent a side of the openings 21. It is understood to those of skill in the art that in various embodiments of the tab mechanism provided in the present disclosure that one or more, or a plurality of indexing portions 20 can be provided for the file folder 10. A plurality of openings 21 can be provided along fold edge 15 for receiving the indexing portions 20, and first and second regions 60, 70 can be disposed on each side of the openings 21 along the fold edge 15 to improve durability of the areas of the file cover 10 that support the load from the first cover panel 11, and which can be narrower than a width of the cover panel due to the openings 21. As shown in FIG. 2, most of the paper of the fold edge 15 of the first cover panel 11 is cut away, so that only small strips of the paper remained hanging from and folded over the hanging member 40. To solve a longevity problem, the support portion 50 can be mounted around the top of the hanging member 40 so that the support portion 50 can take weight of the items that are held in the file folder 10.

As seen in FIG. 4, the support portion 50 can be z-folded such that a first tab mechanism panel 51 and a second tab mechanism panel 52 can be disposed on opposite sides of the hanging member 40 with a fold 53 extending over the top of the hanging member 40, and a third tab mechanism panel 54 folded up at a fold 55 from the second tab mechanism panel 52 and including the indexing portion 20. The folded-over portion 16 of the first cover panel 11 can provide a concealing flap extending from the fold edge 15 that can extend over the hanging member 40 and support portion 50 and affixed to the first cover panel 11 at an edge 17, providing an enclosed pocket 30 substantially containing the tab mechanism.

Figure 7:
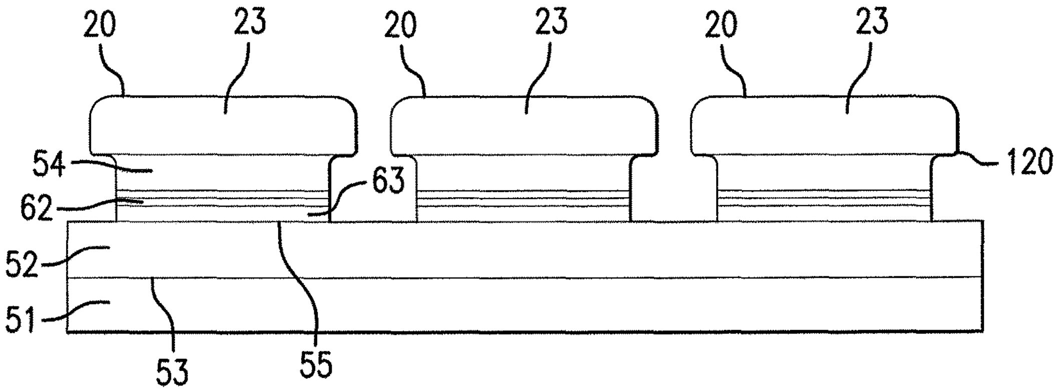
FIG. 7 is an example tabbing and support blank in accordance with one embodiment.

As seen in FIG. 4, the third tab mechanism panel 54 is preferably segmented, and can include an anchor portion 63 attached to the second tab mechanism panel 52, and an intermediate portion 65 connecting the anchor portion 63 and indexing portion 20. The third tab mechanism panel 54 can be configured for folding along hinges 61 to allow the indexing portion 20 to move between the retracted position and the extended position, wherein the indexing portion 20, anchor portion 63 and intermediate portion 65 are hingedly connected to each other for allowing the indexing portion 20 to slide between a retracted position, substantially within the pocket 30, and an extended position, protruding from the pocket as a tab. Hinges 61, such as living hinges provided at folds, allow the third tab mechanism panel 54 to bend along the hinges 61 of the intermediate portion 65 and anchor portion 63. More or less intermediate segments can be provided depending on the size of the slidable tab required, and one of ordinary skill in the art would understand how many intermediate segments to provide based on the particular application needed. The intermediate portion 65 can include a plurality of intermediate segments 62 hinged to each other for progressively retracting and extending the indexing portion 20. FIG. 7 shows an integral blank of the support portion 50 and the indexing portion 20, including anchor portion 63, panel 54, panel 52, panel 51, fold 53, fold 55, and segments 62, etc. Panels 54, 52, and 51 can be bent and curved with respect to one another to provide the best support, i.e., a curved configuration and fold 53, to support the remaining pieces of the folder along the edge 15, in order to solve the longevity problem. FIG. 7 should be viewed in connection with FIG. 4 for a full understanding of the structure.

The indexing segment 23 preferably has an information insert, so that a user can view the information insert on the indexing portion 20. Having more than one indexing portion 20 on a folder allows different information inserts to be provided on one folder, if required. The indexing segment 23 can have any suitable width, which can be selected based on, for example, the size of the particular filing system, size of the opening of the tab holder, and desired use. For a conventional manila folder or hanging folder of a width up to about 15 inches, the indexing segment can have a width of preferably at least about a quarter inch, more preferably at least about a half inch, and still more preferably at least about 1 inch, and at most about 12 inches, preferably at most about 10 inches. In preferred examples, the width is about 1 to 3 or 5 inches.

Figure 5C:
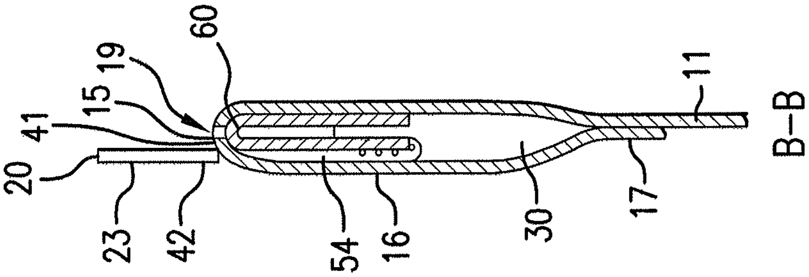
FIGS. 5*a*-5*c* are side views of an embodiment of an indexing portion being lifted.
Figure 5B:
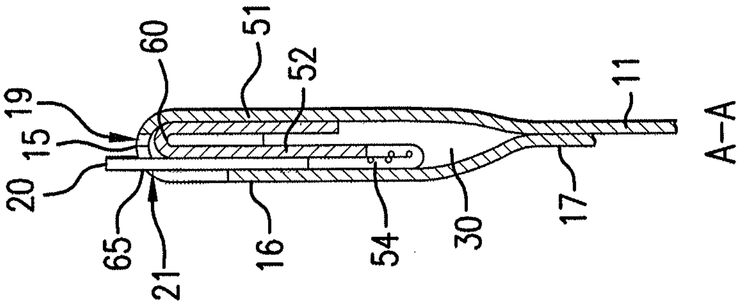
Figure 5A:
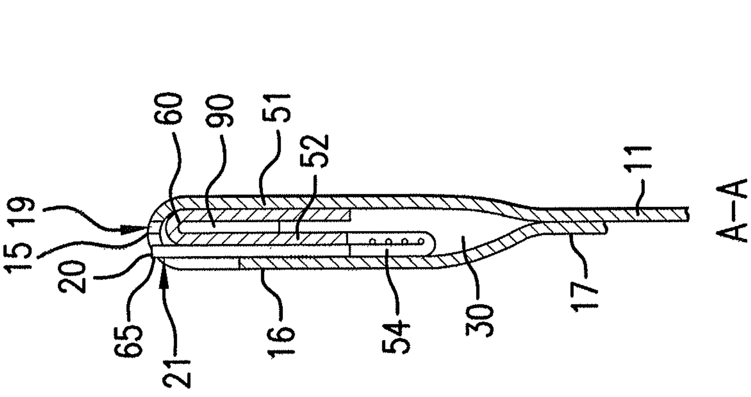

FIGS. 5*a*-5*c* illustrate a method of pulling the indexing portion 20 out of the pocket 30. FIG. 5*a* illustrates a cross-sectional view of the indexing portion 20 and first cover panel 11 taken along line A-A of FIG. 1. FIG. 5*b* illustrates a cross-sectional view of the indexing portion 20 and the first cover panel taken along line B-B of FIG. 1. The indexing portion 20 can be configured for being received within the pocket 30 in a retracted position, as shown in FIG. 5*a*, and protruding from the opening 21 out of the pocket 30 in, an extended position, as shown in FIG. 5*c*.

In FIG. 5*a*, when the indexing segment 23 is in a retracted position, the indexing portion 20 is enclosed within the pocket 30. The intermediate segments 62 are bent at the hinges 61 so that the indexing portion 20 can be enclosed within the pocket 30. Preferably, anchor portion 63 is secured against an inner wall of the pocket by an adhesive or some other means as would be known to one of ordinary skill in the art. It can also be secured against the outer wall of the pocket, or both walls in alternative embodiments.

In FIG. 5*b*, when a user lifts up the indexing portion 20 from the indexing segment 23 (through the cutout portion 21 as explained above), the indexing portion 20 linearly moves up from the pocket 30 through the slit 19. Because the anchor portion 63 does not move, the indexing segment 23 and intermediate segments 62 push against the outer wall of the indexing pocket 30, causing the walls of the pocket to expand slightly. In 5*c*, the indexing portion segment 23 is out of the pocket. Removing and re-inserting the indexing segment 23 can be accomplished in the manner described above.

In some embodiments, when the indexing segment 23 is in a mid position (FIG. 5*b*) between the extended position and retracted position, the walls bias the indexing segment 23 away from a mid position toward the extended or retracted position depending on which side of the mid position the indexing segment 23 is on.

The intermediate segments 62 fold over themselves when the indexing segment 23 moves between the extended and retracted positions. The indexing segment 23 substantially maintains its orientation while moving between the extended and retracted positions, such that it can slide without rotating about an axis parallel to the slits 19. The indexing segment 23 points out of the pocket 30 throughout the movement between the extended and retracted positions.

The preferred tab system can be used to tab or index structures such as files, such as file folders, shelf folders, hanging files, expandable folders, dividers, books, notebooks, or binders. In one embodiment, the index tab system is provided as an integral assembly that is attached to the file or other structure, which in the preferred embodiment is a hanging file, such as by an adhesive. For example, the support portion 50 may be provided with a pressure sensitive adhesive strip applied to one side of the support portion 50, such as on the side where the first tab mechanism panel 51 is in contact with the first cover panel 11, so that it may be adhered to the edge of a structure to be indexed or tabbed.

The preferred material for the support portion can be any thermoplastic material. Especially preferred from a cost and performance standpoint are polypropylene and PVC. However, as any skilled person in the art would know, any other resilient thermoplastic film may be used. The support portion is preferably heat sealed in locations to attach to the first cover panel. Other methods known in the art can also be used to attach the first tab mechanism panel 51 to the first cover panel 11. The width and length of the support portion may vary depending upon whether the object to be tabbed is a hanging file, other folder, notebook, or index card. However, the preferable length of each indexing portion 20 is approximately 1 to 3 inches, when 5 indexing portions 20 are provided and approximately 2.5 to 4.5 when 3 indexing portions 20 are provided. Of course, if the tabbing of index cards is desirable a smaller length is desirable. Other ranges are also possible.

Color coding of the slidable indexing portions or even the inserts can be used for the most efficient organization of file materials. The support portion and/or slidable indexing, portions may be colored and substantially transparent. The slidable indexing portions may be of different color than the object to be indexed. The informational inserts for the slidable indexing portions may be of a different color, or even some of the slidable indexing portions may be of different colors. The indexing segment 23 can have a writable surface configured and dimensioned for writing thereon, or can provide a label pocket for receiving and informational insert or label therein.

The slidable indexing portions may be of any shape or size, including shapes such as hearts, diamonds, animals, balloons, or other shapes that are appealable especially to children. These shapes can be achieved utilizing conventional die cutters.

The slidable tab structure is preferably rectangular shaped. However, as those skilled in the art will appreciate, the slidable indexing portions, or slidable tabs, can be cut in a variety of shapes and sizes. For example, to appeal to children, the slidable tabs can be formed in the shape of animals, or flowers, for instance. Additionally, the slidable tab structure may be sized and shaped to receive a business logo for marketing purposes.

In use, a plastic support portion with integral slidable indexing portions can be attached to the edge of an object to be tabbed. By way of example and without intending to be limiting, the support portion with integral slidable indexing portions is affixed to the edge of a hanging file by application of hot melt adhesive. An informational insert may be slid into the cavity or internal space of the indexing segments of the slidable tabs. More than one slidable tab may be provided, as necessary, on the pocket, depending on the requirement of the object to be tabbed. Also, various sizes of the slidable tabs may be provided.

While the present retractable tabs are described in connection with folders in the following description, it will be appreciated that any suitable filing device, such as binders, dividers, index cards, notebooks, and the like, can include the retractable indexing portions according to the invention. Preferably, the indexing portions are employed on an article that holds or divides a stack or stacks of paper. Further, a plurality of same or different types of filing devices with retractable indexing portions can be included in a filing system, such that different ones of the devices can selectively have indexing portions extended at different positions along the edges thereof for organizing the filing system.

All of the references specifically identified in the detailed description section of the present application are expressly incorporated herein in their entirety by reference thereto. The term "about," as used herein, should generally be understood to refer to both the corresponding number and a range of numbers. Moreover, all numerical ranges herein should be understood to include each whole integer within the range.

While illustrative embodiments of the invention are disclosed herein, it will be appreciated that numerous modifications and other embodiments may be devised by those skilled in the art. For example, the features for the various embodiments can be used in other embodiments. Therefore, it will be understood that the appended claims are intended to cover all such modifications and embodiments that come within the spirit and scope of the present invention.

What is claimed is:

1. An adjustable tab mechanism for a hanging folder, the tab mechanism comprising:

an indexing portion movable between an expanded position and a retracted position; and a support portion positioned in a pocket formed by a cover panel of the folder, the support portion having a first fold extending over a hanging member.

2. The tab mechanism of claim 1, wherein the support portion includes a first panel and a second panel defining the first fold, the first panel and the second panel positioned on opposite sides of the hanging member.

3. The tab mechanism of claim 1, wherein the support portion includes a second fold spaced from the first fold, the first fold and the second fold defining a z-fold of the tab mechanism.

4. The tab mechanism of claim 3, wherein the second fold is positioned between the first fold and a hinge of the folder.

5. The tab mechanism of claim 3, wherein the first fold is positioned between the second fold and an edge of the cover panel.

6. The tab mechanism of claim 3, wherein the second fold at least partially defines an intermediate portion of the tab mechanism interposed between the support portion and the indexing portion, the intermediate portion to facilitate movement of the indexing portion into and out of a pocket of the cover panel.

7. An adjustable tab mechanism for a hanging folder, the tab mechanism comprising:

an indexing portion movable into and out of a pocket of the folder; and means for supporting the indexing portion in the pocket and on a hanging member, the means for supporting positioned in the pocket and extending along a first side and a second side of the hanging member.

8. The tab mechanism of claim 7, wherein the means for supporting includes a z-shaped cross-section.

9. The tab mechanism of claim 8, wherein the z-shaped cross-section includes a first fold to receive at least a portion of the hanging member.

10. The tab mechanism of claim 9, wherein the z-shaped cross-section includes a second fold spaced from the first fold, the indexing portion hingedly connected to the means for supporting via the second fold.

11. The tab mechanism of claim 9, wherein the first fold defines a first panel and a second panel of the means for supporting, the first panel and the second panel positioned on opposite sides of the hanging member.

12. An apparatus comprising:

an indexing portion to moveably extend from a hanging folder;

an intermediate portion enabling the indexing portion to move between an extended position and a retracted position; and a support portion coupled to the indexing portion via the intermediate portion, the support portion including a first fold to engage a hanging member of the hanging folder.

13. The apparatus of claim 12, wherein the support portion includes a second fold spaced from the first fold, the second fold to enable the intermediate portion to extend toward an opening defined by a cover panel of the folder.

14. The apparatus of claim 13, wherein the second fold is positioned between the hanging member and a hinge of the folder.

15. The apparatus of claim 12, wherein the first fold defines a first panel and a second panel of the support portion, the first panel and the second panel to be positioned on opposite sides of the hanging member.

16. The apparatus of claim 15, wherein the first panel, the second panel, and the intermediate portion have a z-shaped cross-section.

* * * * *